United States Patent
Kato et al.

(10) Patent No.: US 10,686,045 B2
(45) Date of Patent: Jun. 16, 2020

(54) SEMICONDUCTOR MEMORY DEVICE AND METHOD FOR MANUFACTURING SAME

(71) Applicant: Toshiba Memory Corporation, Minato-ku (JP)

(72) Inventors: Tatsuya Kato, Yokkaichi (JP); Fumitaka Arai, Yokkaichi (JP); Katsuyuki Sekine, Yokkaichi (JP); Toshiyuki Iwamoto, Mie (JP); Yuta Watanabe, Yokkaichi (JP); Wataru Sakamoto, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 40 days.

(21) Appl. No.: 15/683,941

(22) Filed: Aug. 23, 2017

(65) Prior Publication Data
US 2017/0352735 A1   Dec. 7, 2017

Related U.S. Application Data

(63) Continuation of application No. PCT/JP2015/056102, filed on Mar. 2, 2015.

(51) Int. Cl.
*H01L 29/423* (2006.01)
*H01L 21/28* (2006.01)
(Continued)

(52) U.S. Cl.
CPC .. *H01L 29/42324* (2013.01); *H01L 27/11524* (2013.01); *H01L 27/11556* (2013.01); *H01L 29/40114* (2019.08); *H01L 29/7883* (2013.01)

(58) Field of Classification Search
CPC ......... H01L 27/11524; H01L 29/42324; H01L 27/11556; H01L 29/40114; H01L 29/7883
See application file for complete search history.

(56) References Cited

U.S. PATENT DOCUMENTS

| | | |
|---|---|---|
| 2007/0252201 A1 | 11/2007 | Kito et al. |
| 2010/0320528 A1 | 12/2010 | Jeong et al. |

(Continued)

FOREIGN PATENT DOCUMENTS

| | | |
|---|---|---|
| JP | 2007-266143 | 10/2007 |
| JP | 2012-069606 | 4/2012 |

(Continued)

OTHER PUBLICATIONS

International Search Report dated May 12, 2015 in PCT/JP2015/056102 filed Mar. 2, 2015 (with English translation).

(Continued)

*Primary Examiner* — Matthew C Landau
*Assistant Examiner* — Mark Hatzilambrou
(74) *Attorney, Agent, or Firm* — Oblon, McClelland, Maier & Neustadt, L.L.P.

(57) ABSTRACT

A semiconductor memory device according to an embodiment, includes a pair of first electrodes, a semiconductor pillar, an inter-pillar insulating member, a first insulating film, a second electrode, and a second insulating film. The pair of first electrodes are separated from each other, and extend in a first direction. The semiconductor pillar and the inter-pillar insulating member are arranged alternately along the first direction between the pair of first electrodes. The semiconductor pillar and the inter-pillar insulating member extend in a second direction crossing the first direction. The first insulating film is provided at a periphery of the semiconductor pillar. The second electrode is provided between the first insulating film and each electrode of the pair of first electrodes. The second electrode is not provided between the semiconductor pillar and the inter-pillar insulating member. The second insulating film is provided between the second electrode and the first electrode.

10 Claims, 17 Drawing Sheets

US 10,686,045 B2
Page 2

(51) Int. Cl.
*H01L 27/11524* (2017.01)
*H01L 27/11556* (2017.01)
*H01L 29/788* (2006.01)

(56) References Cited

U.S. PATENT DOCUMENTS

| | | | |
|---|---|---|---|
| 2011/0140068 A1* | 6/2011 | Ozawa | H01L 27/249 |
| | | | 257/4 |
| 2011/0193153 A1* | 8/2011 | Higuchi | H01L 27/11578 |
| | | | 257/324 |
| 2011/0284947 A1 | 11/2011 | Kito et al. | |
| 2011/0287597 A1 | 11/2011 | Kito et al. | |
| 2012/0001247 A1 | 1/2012 | Alsmeier | |
| 2012/0069660 A1 | 3/2012 | Iwai et al. | |
| 2012/0231593 A1* | 9/2012 | Joo | H01L 27/11556 |
| | | | 438/264 |
| 2015/0364485 A1 | 12/2015 | Shimura et al. | |

FOREIGN PATENT DOCUMENTS

| | | |
|---|---|---|
| JP | 2012-094694 | 5/2012 |
| WO | WO 2016/135849 A1 | 9/2016 |

OTHER PUBLICATIONS

Written Opinion dated May 12, 2015 in PCT/JP2015/056102 filed Mar. 2, 2015.

\* cited by examiner

SEMICONDUCTOR MEMORY DEVICE AND METHOD FOR MANUFACTURING SAME

CROSS-REFERENCE TO RELATED APPLICATION

This is a continuation application of International Application PCT/JP2015/056102, filed on Mar. 2, 2015; the entire contents of which are incorporated herein by reference.

FIELD

Embodiments relate to a semiconductor memory device and a method for manufacturing the same.

BACKGROUND

Conventionally, in NAND flash memory, the bit cost has been reduced by increasing the integration by downscaling the planar structure; but the downscaling of the planar structure is approaching a limit. Therefore, in recent years, technology has been proposed to stack the memory cells in the vertical direction. However, the manufacturing of such a stacked type memory device is difficult; and the reliability of the product after completion is a challenge.

DETAILED DESCRIPTION

A semiconductor memory device according to an embodiment, includes a pair of first electrodes, a semiconductor pillar, an inter-pillar insulating member, a first insulating film, a second electrode, and a second insulating film. The pair of first electrodes are separated from each other, and extend in a first direction. The semiconductor pillar and the inter-pillar insulating member are arranged alternately along the first direction between the pair of first electrodes. The semiconductor pillar and the inter-pillar insulating member extend in a second direction crossing the first direction. The first insulating film is provided at a periphery of the semiconductor pillar. The second electrode is provided between the first insulating film and each electrode of the pair of first electrodes. The second electrode is not provided between the semiconductor pillar and the inter-pillar insulating member. The second insulating film is provided between the second electrode and the first electrode.

A method for manufacturing a semiconductor memory device includes forming a stacked body by alternately stacking an inter-layer insulating film and a first film. The method includes forming a trench in the stacked body. The trench extends in a first direction. The first direction crosses a stacking direction of the inter-layer insulating film and the first film. The method includes forming a plurality of inter-pillar insulating members separated from each other along the first direction inside the trench. The method includes forming a first recess between the inter-layer insulating films by performing isotropic etching of the first film via a hole. The hole is interposed between the inter-pillar insulating members inside the trench. The first recess communicates with the hole. The method includes forming a first insulating layer on an inner surface of the first recess, and forming a second electrode inside the first recess. The method includes forming a first insulating film on an inner surface of the hole. The method includes forming a semiconductor pillar on the first insulating film. The method includes forming a slit in a portion of the stacked body between the trenches. The slit extends in the first direction. The method includes forming a second recess between the inter-layer insulating films by removing the first film via the slit. The method includes forming a second insulating layer on an inner surface of the second recess. The method includes forming a first electrode inside the second recess.

Embodiments of the invention will now be described with reference to the drawings.

First, a first embodiment will be described.

Figure 1A:
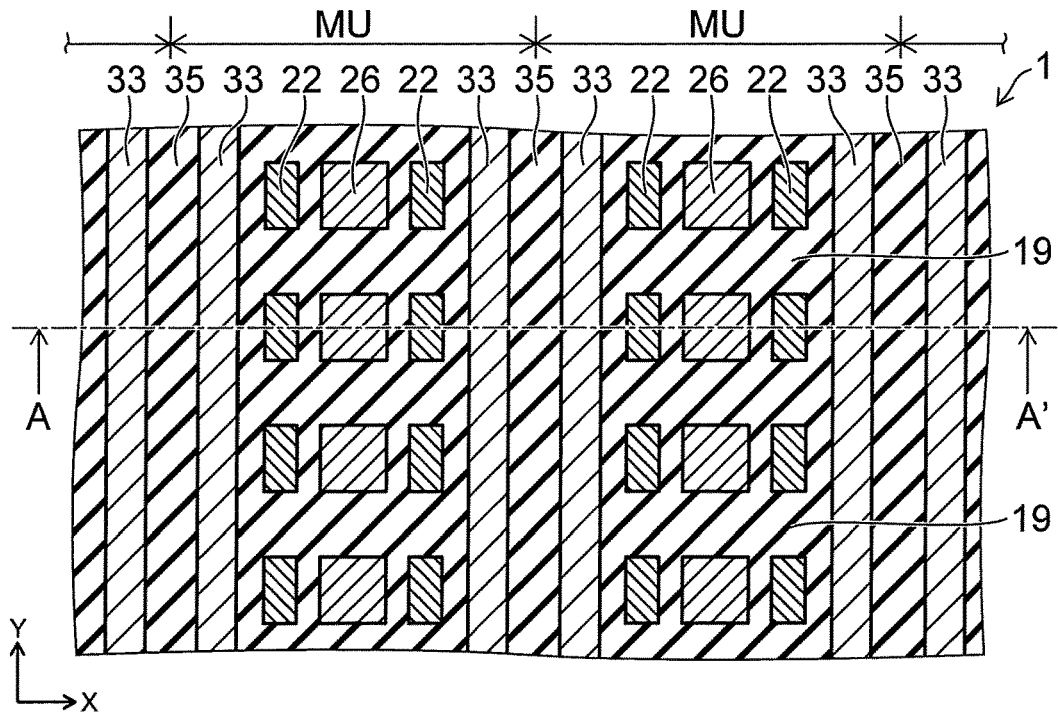
FIG. 1A and FIG. 1B are cross-sectional views illustrating a semiconductor memory device according to a first embodiment.
Figure 1B:
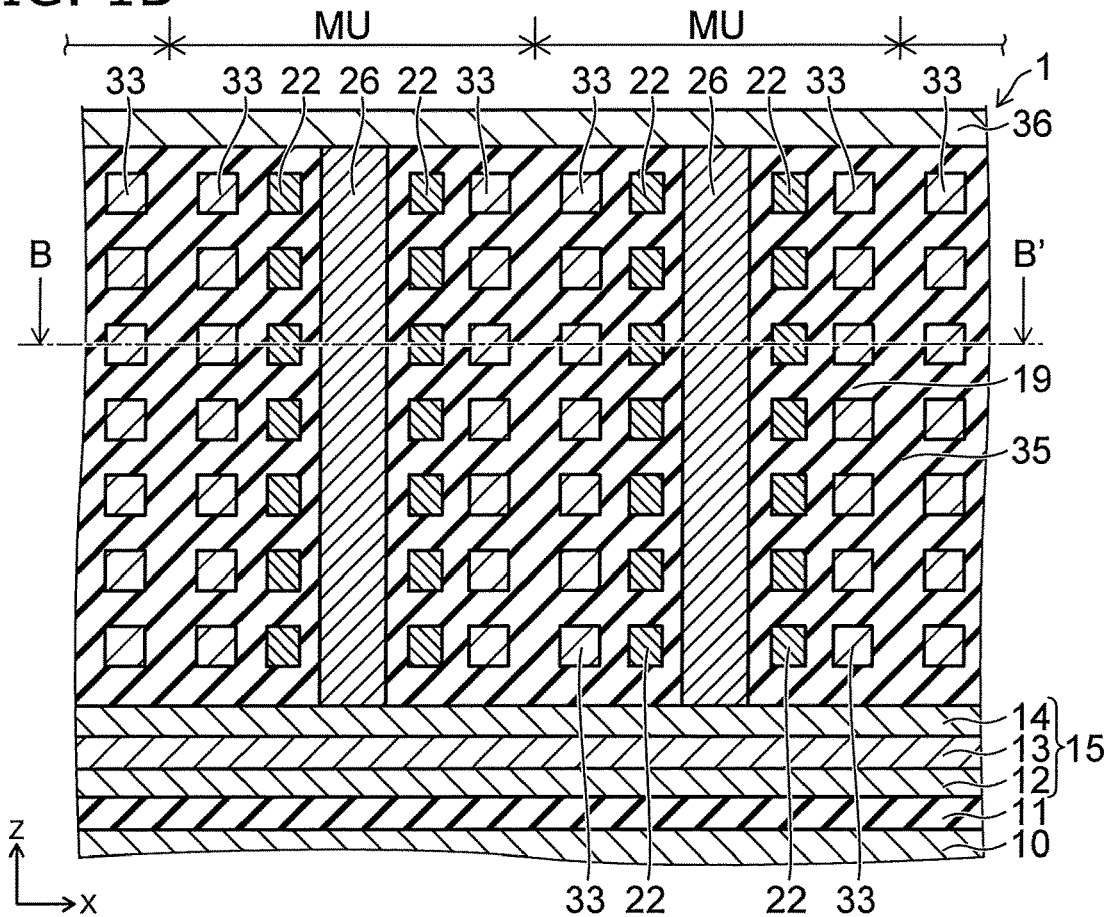

FIG. 1A and FIG. 1B are cross-sectional views illustrating a semiconductor memory device according to the embodiment.

Figure 2A:
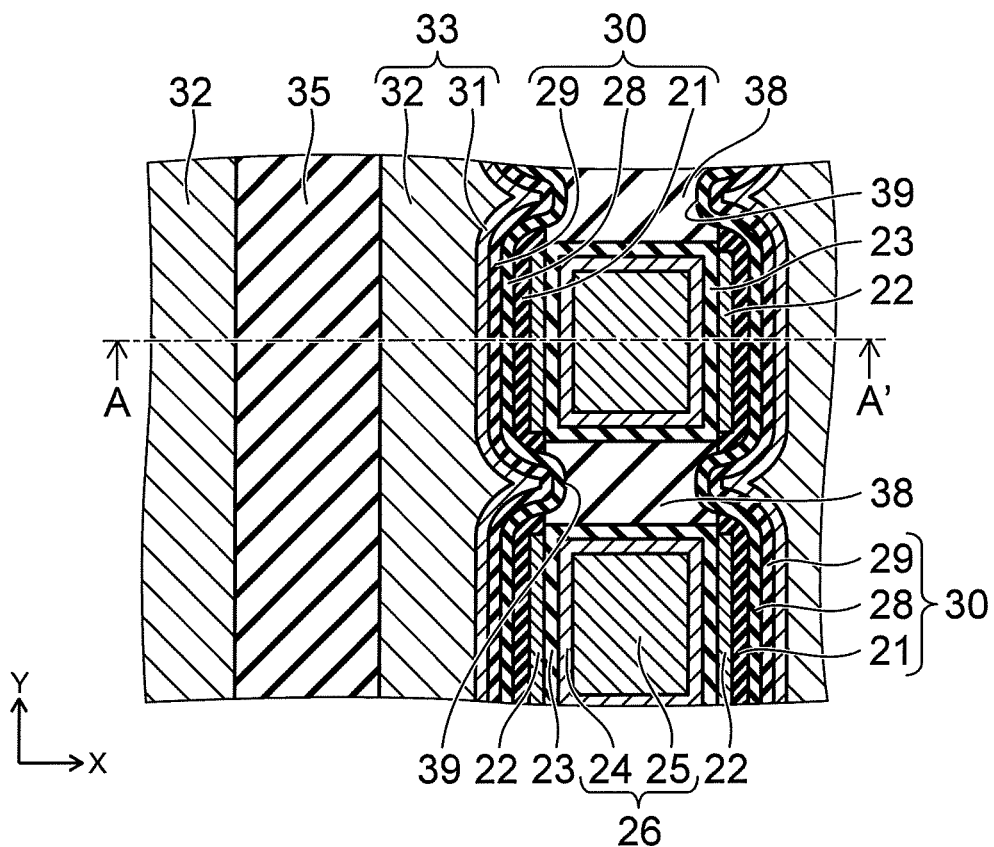
FIG. 2A and FIG. 2B are partially enlarged cross-sectional views illustrating the semiconductor memory device according to the first embodiment.
Figure 2B:
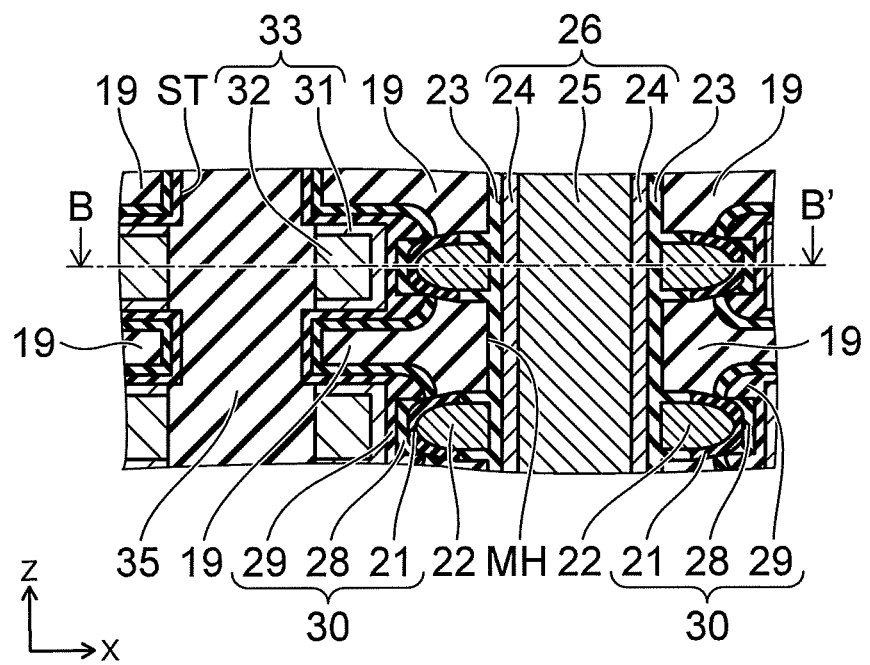

FIG. 2A and FIG. 2B are partially enlarged cross-sectional views illustrating the semiconductor memory device according to the embodiment.

FIG. 1B shows a cross section along line A-A' shown in FIG. 1A; and FIG. 1A shows a cross section along line B-B' shown in FIG. 1B. Similarly, FIG. 2B shows a cross section along line A-A' shown in FIG. 2A; and FIG. 2A shows a cross section along line B-B' shown in FIG. 2B.

As shown in FIG. 1A and FIG. 1B, a silicon substrate 10 is provided in the semiconductor memory device 1 according to the embodiment. Hereinbelow, an XYZ orthogonal coordinate system is employed in the specification for convenience of description. Two mutually-orthogonal directions parallel to the upper surface of the silicon substrate 10 are taken as an "X-direction" and a "Y-direction;" and a direction perpendicular to the upper surface is taken as a "Z-direction."

An insulating film 11 that is made of, for example, silicon oxide, a conductive layer 12 that is made of, for example, polysilicon, an interconnect layer 13 that is made of, for example, tungsten, and a conductive layer 14 that is made of, for example, polysilicon are stacked in this order on the silicon substrate 10. A cell source line 15 is formed of the conductive layer 12, the interconnect layer 13, and the conductive layer 14. The cell source line 15 spreads along the XY plane.

Multiple silicon pillars 26 that extend in the Z-direction are provided on the cell source line 15. The lower ends of the silicon pillars 26 are connected to the cell source line 15. The silicon pillars 26 are arranged in a matrix configuration along the X-direction and the Y-direction. Multiple bit lines 36 that extend in the X-direction are provided on the silicon pillars 26. Each of the bit lines 36 is connected to the upper ends of the multiple silicon pillars 26 arranged in one column along the X-direction.

Also, multiple control gate electrodes 33 that extend in the Y-direction are provided on the cell source line 15. The control gate electrodes 33 are arranged in one column along the Z-direction on each of the two X-direction sides of the silicon pillars 26 arranged in one column along the Y-direction.

Floating gate electrodes 22 are provided between the silicon pillars 26 and the control gate electrodes 33. The floating gate electrodes 22 are disposed at each crossing portion between the silicon pillars 26 and the control gate electrodes 33. In other words, the multiple floating gate electrodes 22 are arranged in a matrix configuration separated from each other along the Y-direction and the Z-direction between the column of the silicon pillars 26 arranged in one column along the Y-direction and the column of the control gate electrodes 33 arranged in one column along the Z-direction.

One memory unit MU includes the silicon pillars 26 arranged in one column along the Y-direction, the control gate electrodes 33 arranged in one column along the Z-direction and disposed on each of the two sides of the silicon pillars 26, and the floating gate electrodes 22 provided between the silicon pillars 26 and the control gate electrodes 33. Also, in the semiconductor memory device 1, multiple memory units MU are arranged along the X-direction.

In other words, the control gate electrodes 33 of two columns arranged along the Z-direction are included in one bundle; a column of the silicon pillars 26 arranged in one column along the Y-direction is disposed between the bundle; and the floating gate electrodes 22 that are arranged in a matrix configuration along the Y-direction and the Z-direction are disposed between the bundle of the control gate electrodes 33 and the column of the silicon pillars 26. Also, as described below, an insulating material is filled between the cell source line 15, the silicon pillars 26, the control gate electrodes 33, the floating gate electrodes 22, and the bit lines 36.

As shown in FIG. 2A and FIG. 2B, the silicon pillar 26 includes body silicon 25 used as a core material, and a cover silicon layer 24 surrounding the periphery of the body silicon 25. As the entirety, the silicon pillar 26 is formed of, for example, polysilicon. A tunneling insulating film 23 that is made of, for example, silicon oxide is provided at the periphery of the silicon pillar 26.

An inter-pillar insulating member 38 that is made of, for example, silicon oxide is provided between the tunneling insulating films 23 adjacent to each other in the Y-direction. Recesses 39 that extend in the Z-direction are formed in the side surfaces of the inter-pillar insulating member 38 facing the two X-direction sides. The configurations of the recesses 39 are, for example, semicircular columns having the Z-direction as the axis directions.

The side surfaces of the tunneling insulating film 23 facing the two X-direction sides contact the floating gate electrodes 22. The floating gate electrodes 22 are formed of, for example, polysilicon.

On the other hand, the control gate electrode 33 includes a tungsten film 32, and a barrier metal layer 31 that is provided on the upper surface of the tungsten film 32, on the lower surface of the tungsten film 32, and on the side surface of the tungsten film 32 on the silicon pillar 26 side. The barrier metal layer 31 is formed of, for example, titanium nitride (TiN).

A blocking insulating film 30 is provided between the floating gate electrode 22 and the barrier metal layer 31. The blocking insulating film 30 is provided also on the end surfaces of the floating gate electrode 22 facing the two Y-direction sides. A hafnium oxide layer 21, a silicon oxide layer 28, and a hafnium oxide layer 29 are stacked in the blocking insulating film 30 in order from the floating gate electrode 22 side. Thus, the dielectric constant of the blocking insulating film 30 is higher than the dielectric constant of the tunneling insulating film 23 because the blocking insulating film 30 includes, for example, hafnium oxide and the tunneling insulating film 23 is formed of, for example, silicon oxide.

The hafnium oxide layer 21 extends around also onto the upper surface of the floating gate electrode 22 and onto the lower surface of the floating gate electrode 22. On the other hand, the silicon oxide layer 28 and the hafnium oxide layer 29 are provided also between the inter-pillar insulating member 38 and the control gate electrode 33 and are disposed also on the inner surface of the recess 39 of the inter-pillar insulating member 38. Further, the silicon oxide layer 28 and the hafnium oxide layer 29 are disposed also on the upper surface of the control gate electrode 33 and on the lower surface of the control gate electrode 33. Further, a portion of the control gate electrode 33 is disposed inside the recess 39 and is thereby disposed between the silicon pillars 26 adjacent to each other in the Y-direction.

An insulating member 35 that is made of, for example, silicon oxide is provided between the control gate electrodes 33 adjacent to each other in the X-direction that are between the silicon pillars 26 adjacent to each other in the X-direction. Also, a silicon oxide layer 19 is provided as an inter-layer insulating film between the control gate electrodes 33 adjacent to each other in the Z-direction.

In the semiconductor memory device 1, a memory cell transistor that includes one floating gate electrode 22 is formed at each crossing portion between the silicon pillars 26 and the control gate electrodes 33. Also, a NAND string, in which the multiple memory cell transistors are connected in series, is connected between the bit line 36 and the cell source line 15.

A method for manufacturing the semiconductor memory device according to the embodiment will now be described.

Figure 3:
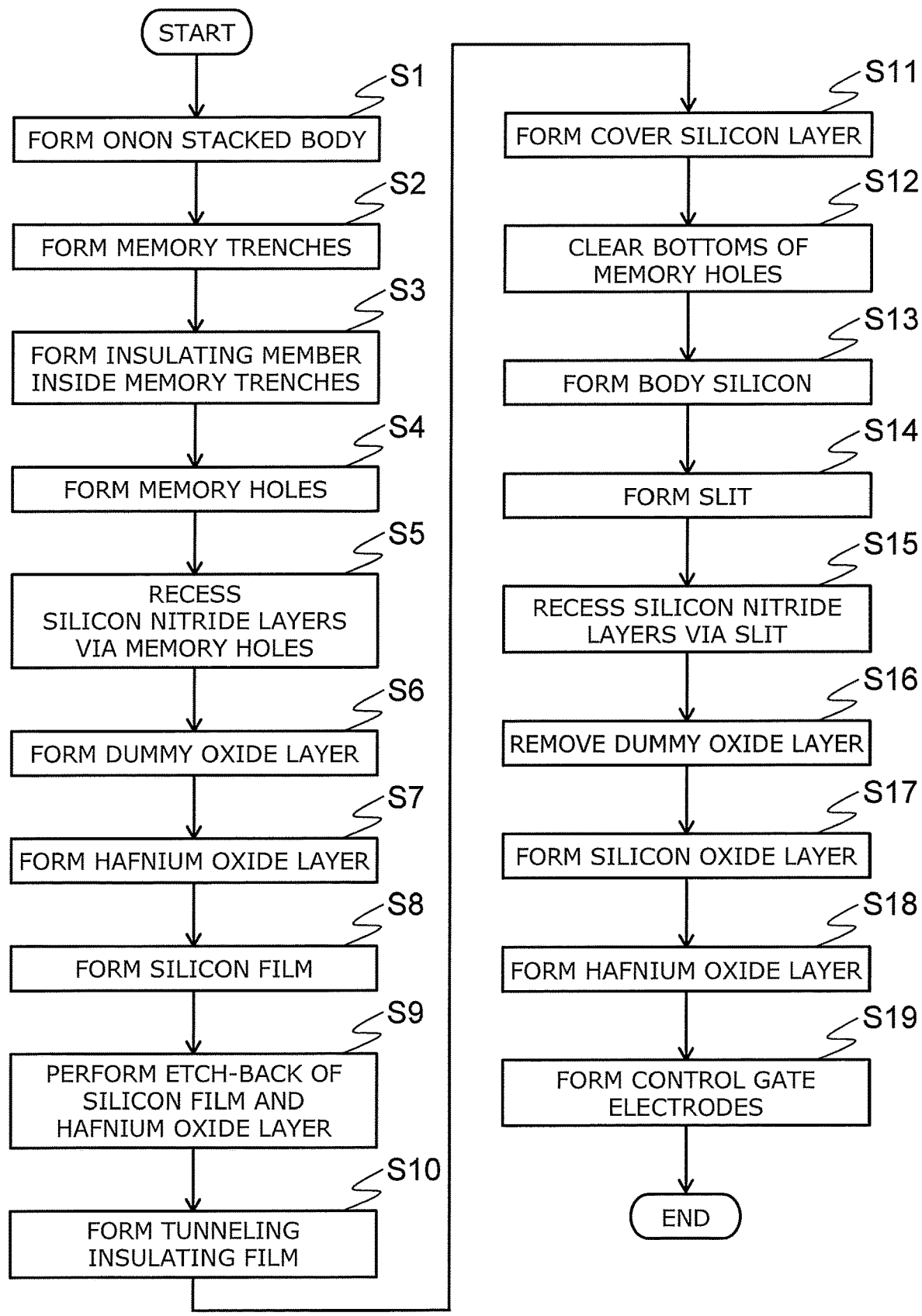
FIG. 3 is a flowchart illustrating a method for manufacturing the semiconductor memory device according to the first embodiment.

FIG. 3 is a flowchart illustrating the method for manufacturing the semiconductor memory device according to the embodiment.

FIG. 4A to FIG. 14B are cross-sectional views illustrating the method for manufacturing the semiconductor memory device according to the embodiment.

Figure 4A:
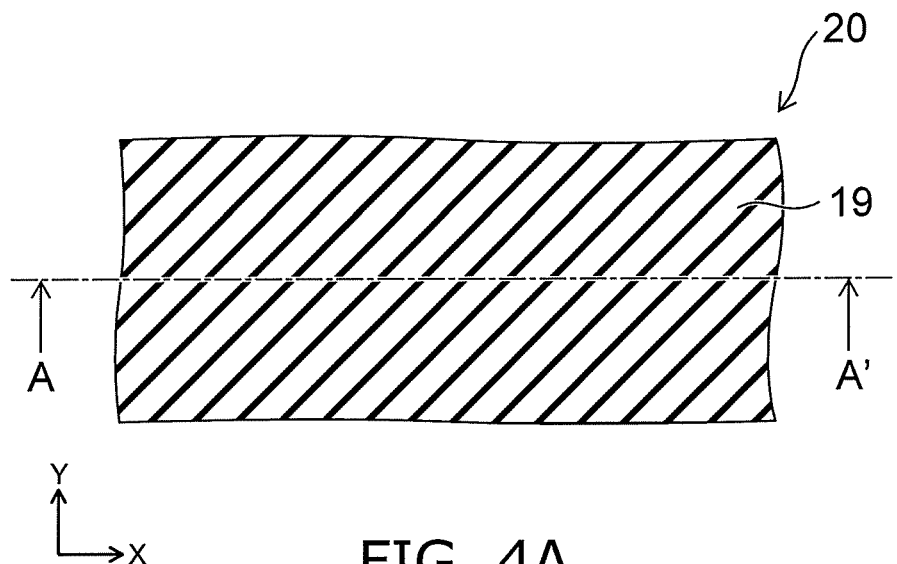
FIG. 4A to FIG. 14B are cross-sectional views illustrating the method for manufacturing the semiconductor memory device according to the first embodiment.
Figure 4B:
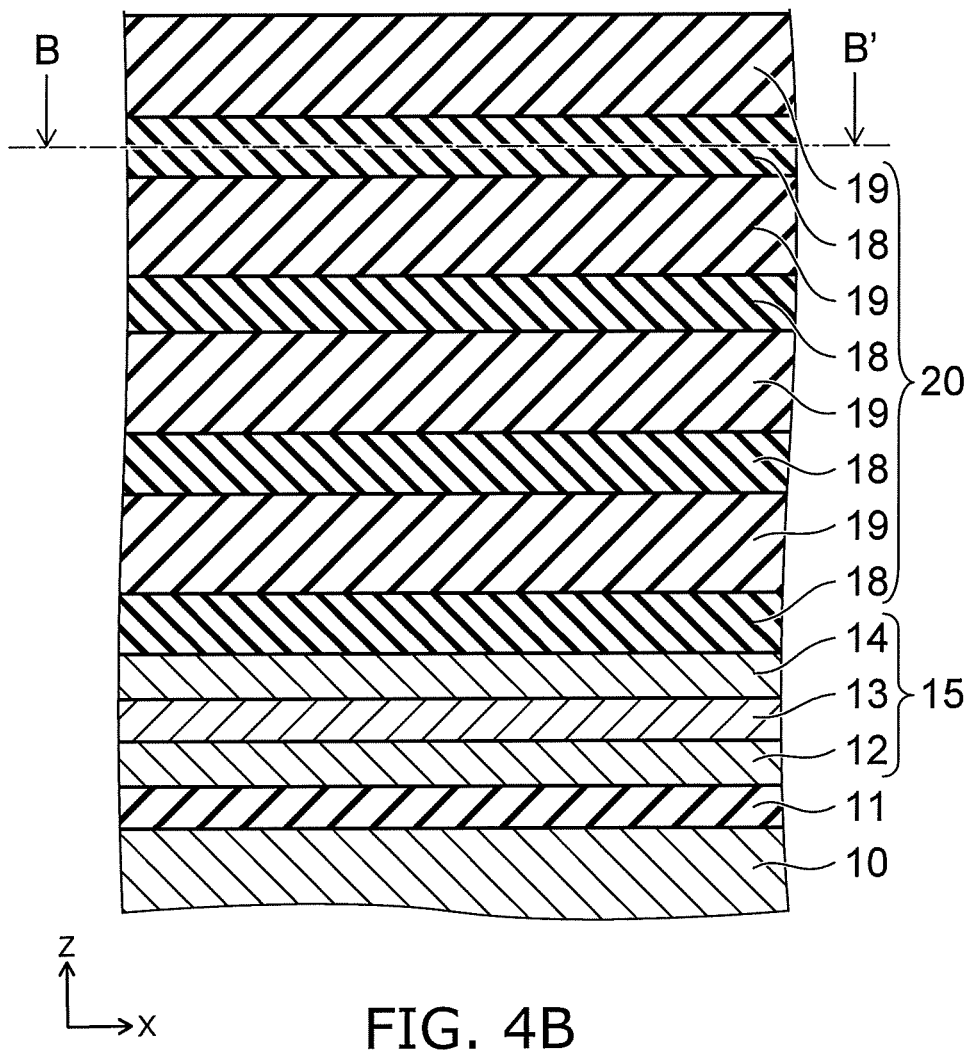

FIG. 4A and FIG. 4B show the same process; FIG. 4B shows a cross section along line A-A' shown in FIG. 4A; and FIG. 4A shows a cross section along line B-B' shown in FIG. 4B. This is similar for FIG. 5A to FIG. 14B as well.

First, the silicon substrate 10 is prepared as shown in FIGS. 4A and 4B.

Then, the insulating film 11, the conductive layer 12, the interconnect layer 13, and the conductive layer 14 are formed in this order on the silicon substrate 10. The cell source line 15 is formed of the conductive layer 12, the interconnect layer 13, and the conductive layer 14.

Then, as shown in step S1 of FIG. 3, an ONON stacked body 20 is formed by alternately stacking silicon nitride layers 18 and the silicon oxide layers 19 on the conductive layer 14.

Figure 5A:
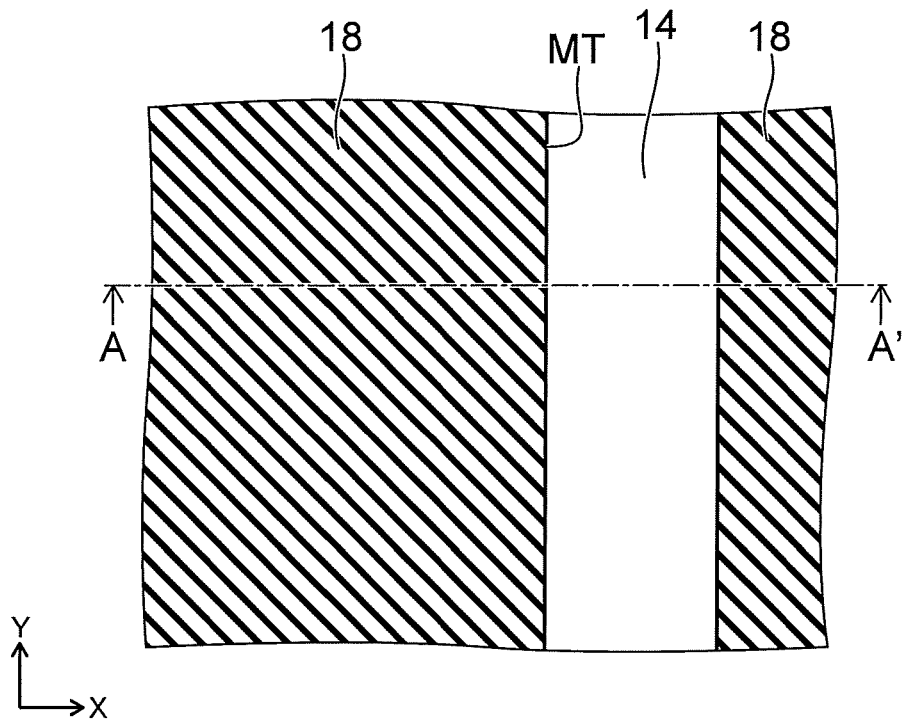
Figure 5B:
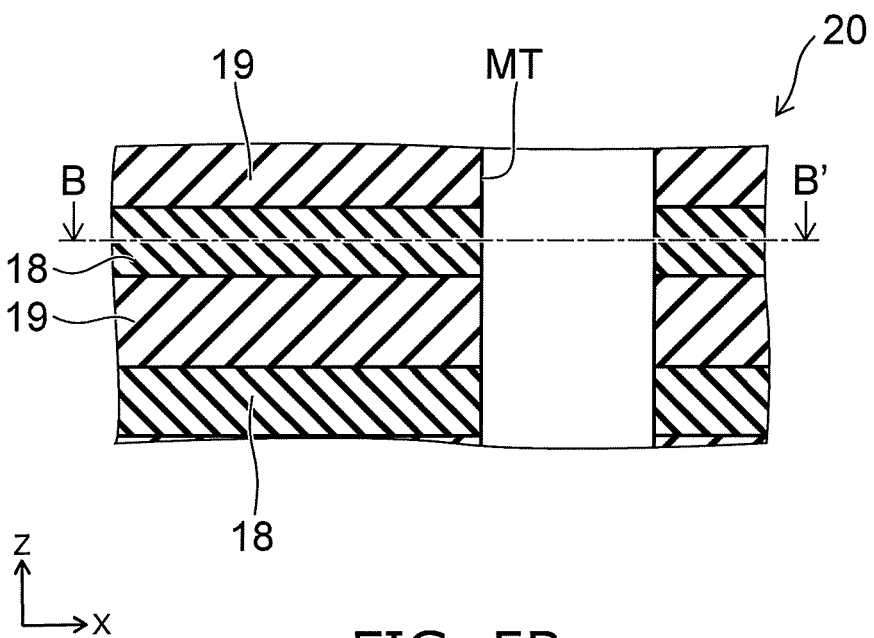

Then, as shown in FIG. 5A, FIG. 5B, and step S2 of FIG. 3, multiple memory trenches MT that extend in the Y-direction are formed in the stacked body 20 by, for example, anisotropic etching such as RIE (Reactive Ion Etching), etc. The conductive layer 14 is exposed at the bottom surfaces of the memory trenches MT.

Figure 6A:
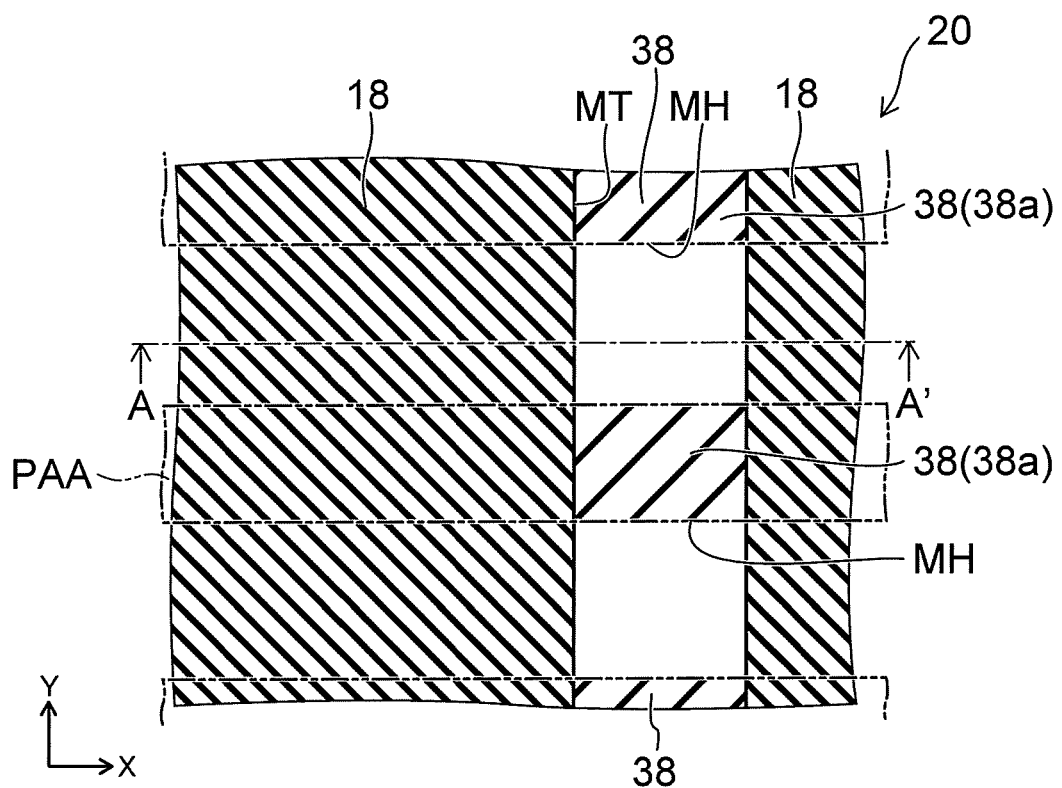
Figure 6B:
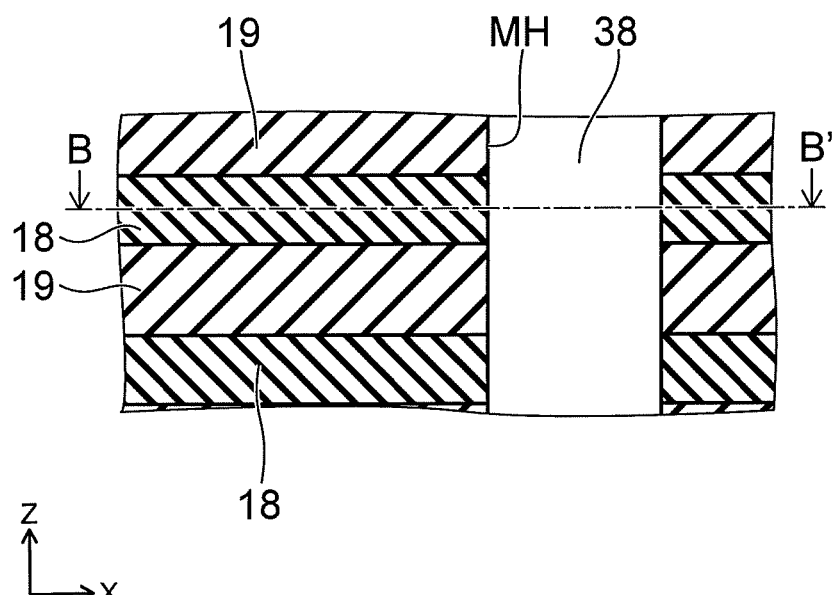

Then, as shown in FIG. 6A, FIG. 6B, and step S3 of FIG. 3, an insulating member 38a that is made of, for example, silicon oxide is filled into the entire interior of the memory trenches MT using, for example, CVD (Chemical Vapor Deposition).

Then, as shown in step S4 of FIG. 3, a pattern PAA in which lines-and-spaces are repeated along the Y-direction is formed on the stacked body 20 and the insulating member 38a. Each line and each space of the pattern PAA extend in the X-direction. Then, by performing anisotropic etching such as RIE or the like using the pattern PAA and the silicon nitride layer 18 of the uppermost layer as a mask, the insulating member 38a is divided along the Y-direction and patterned into the multiple inter-pillar insulating members 38 arranged discontinuously along the Y-direction. Thereby, the spaces inside each of the memory trenches MT where the insulating member 38a is removed become memory holes MH. In other words, the memory holes MH and the inter-pillar insulating members 38 are arranged alternately along the Y-direction inside each of the memory trenches MT.

Figure 7A:
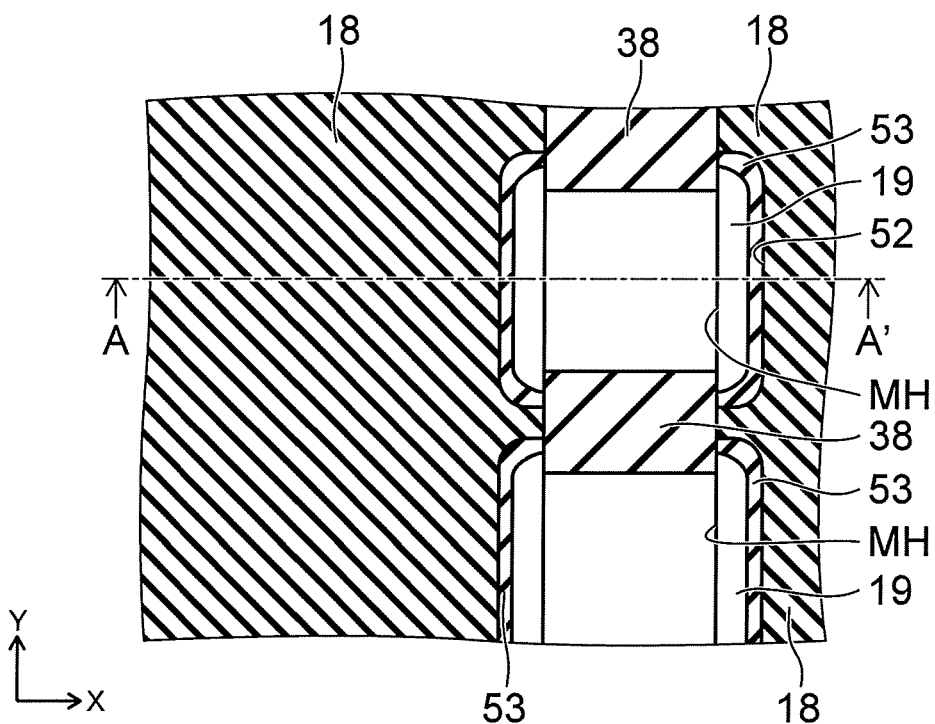
Figure 7B:
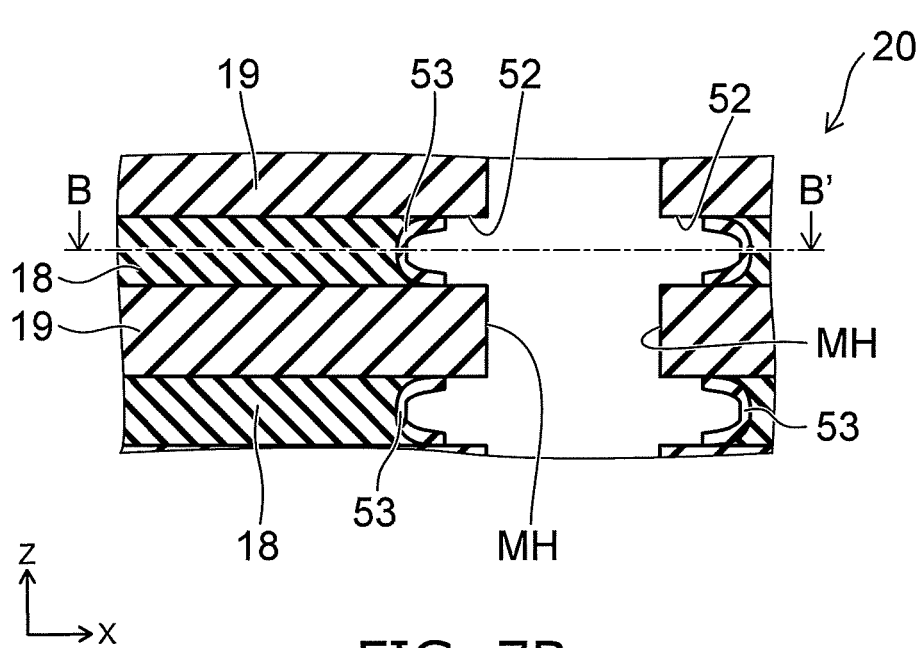

Then, as shown in FIG. 7A, FIG. 7B, and step S5 of FIG. 3, the silicon nitride layers 18 are recessed via the memory holes MH by, for example, wet etching using hot phosphoric acid. Thereby, the surface of the side surface of the memory hole MH recedes where the silicon nitride layers 18 are exposed; and recesses 52 are formed between the silicon oxide layers 19. The recesses 52 are formed in the two X-direction sides of the memory hole MH and are enlarged onto a portion of the side surfaces of the inter-pillar insulating member 38 facing the two X-direction sides.

Then, as shown in step S6 of FIG. 3, a dummy oxide layer 53 is formed on the exposed surfaces of the silicon nitride layers 18 by performing, for example, thermal oxidation treatment.

Figure 8A:
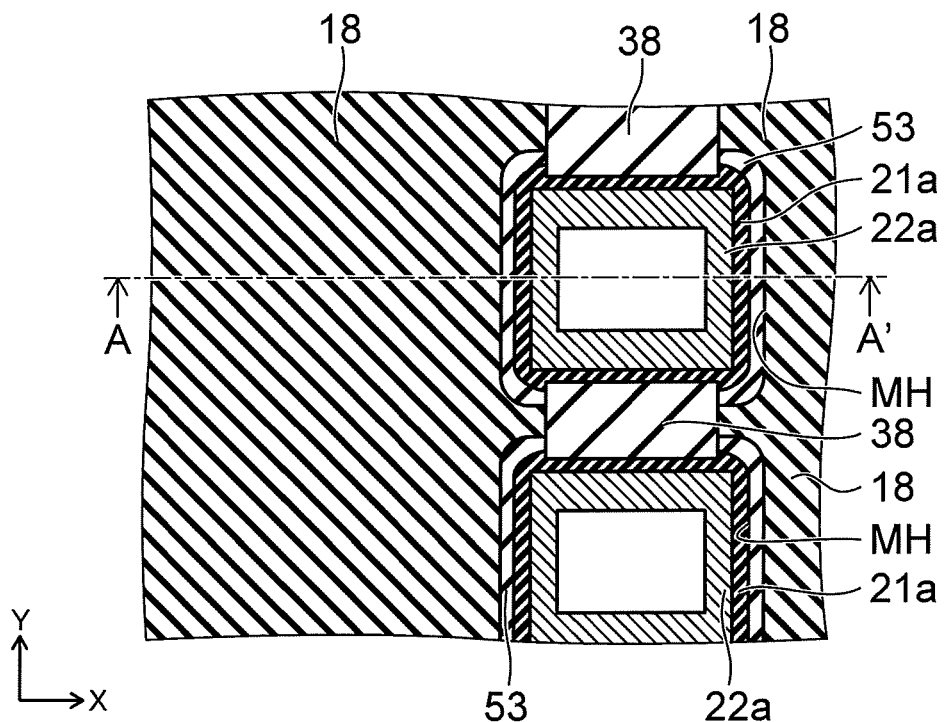
Figure 8B:
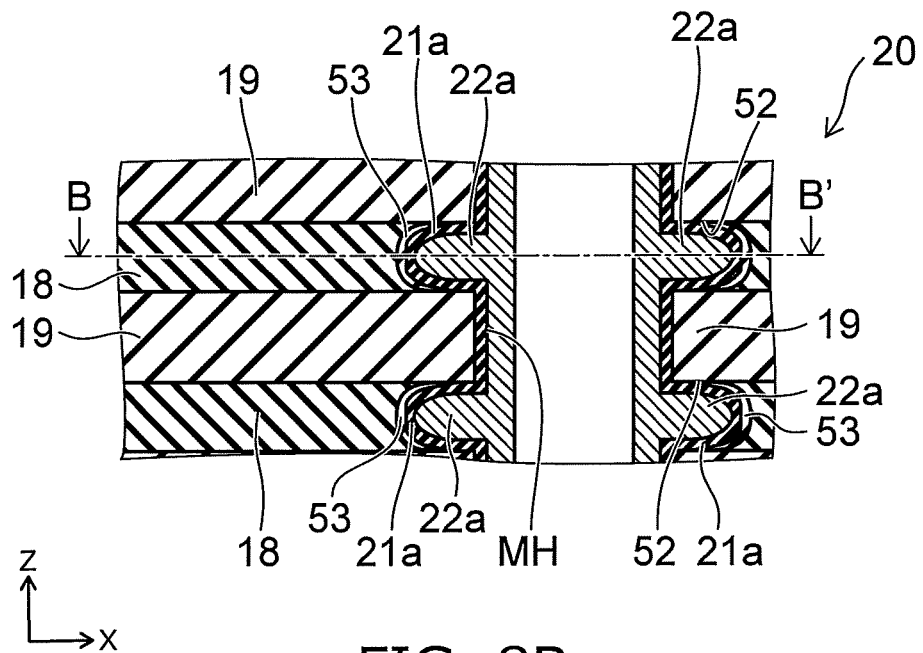

Then, as shown in FIG. 8A, FIG. 8B, and step S7 of FIG. 3, a hafnium oxide layer 21a is formed on the inner surfaces of the memory holes MH. The hafnium oxide layer 21a is formed not to completely fill the recesses 52.

Then, as shown in step S8 of FIG. 3, a silicon film 22a is formed on the hafnium oxide layer 21a. The silicon film 22a is formed not to completely fill the memory holes MH.

Figure 9A:
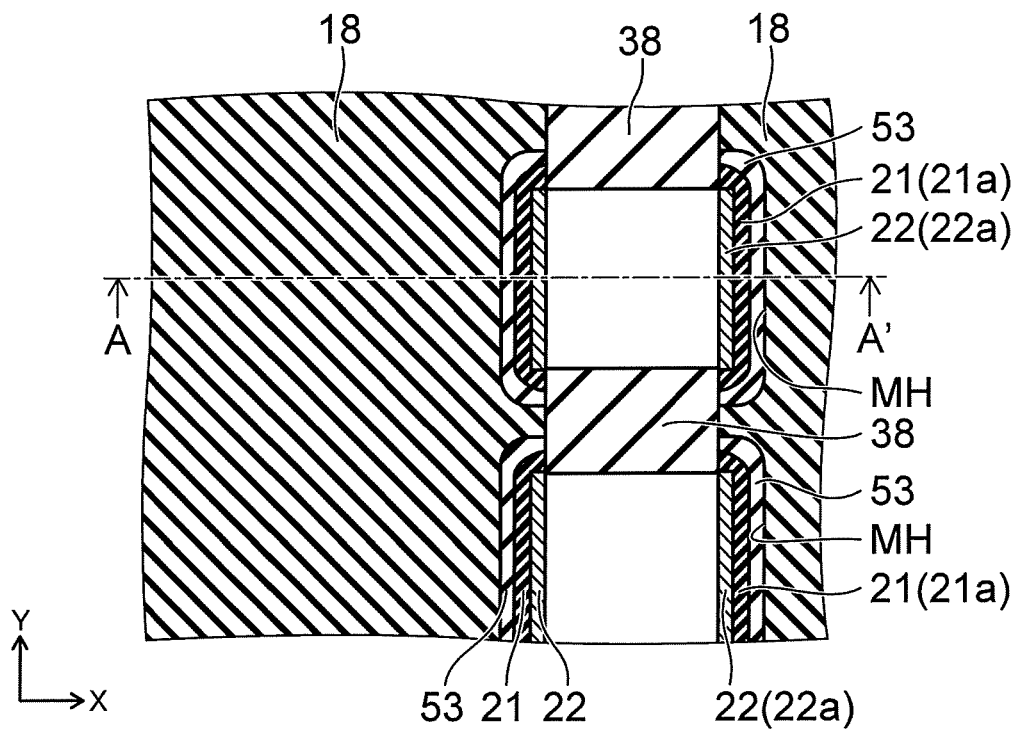
Figure 9B:
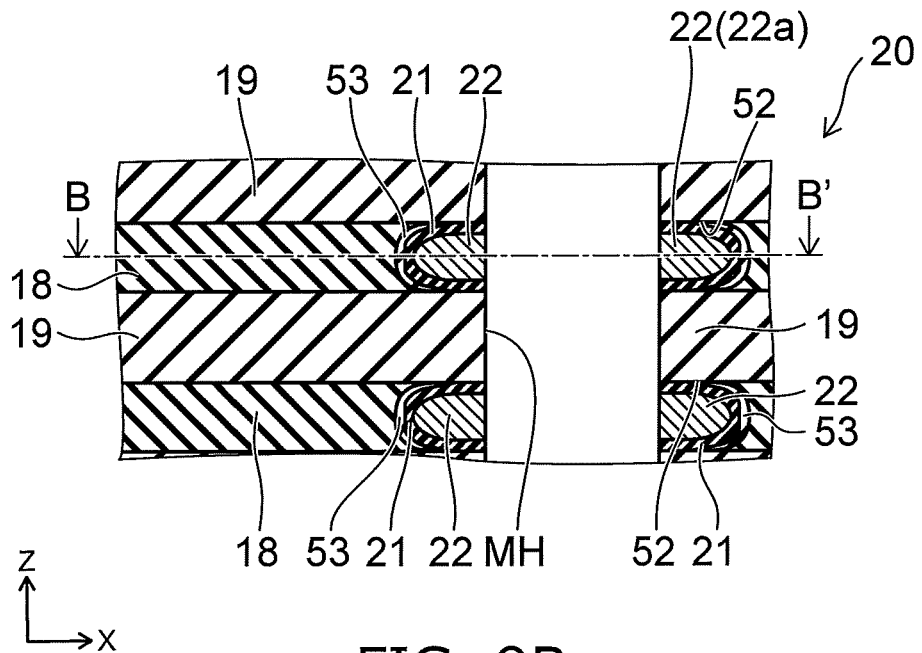

Then, as shown in FIG. 9A, FIG. 9B, and step S9 of FIG. 3, etch-back of the silicon film 22a is performed by performing, for example, anisotropic etching such as RIE, etc. Thereby, the silicon film 22a is divided every recess 52. As a result, the floating gate electrode 22 that is made of silicon is formed inside each of the recesses 52. Then, etch-back of the hafnium oxide layer 21a is performed. Thereby, the hafnium oxide layer 21a is divided every recess 52 to become the hafnium oxide layers 21. Isotropic etching such as wet etching, etc., may be performed instead of anisotropic etching.

Figure 10A:
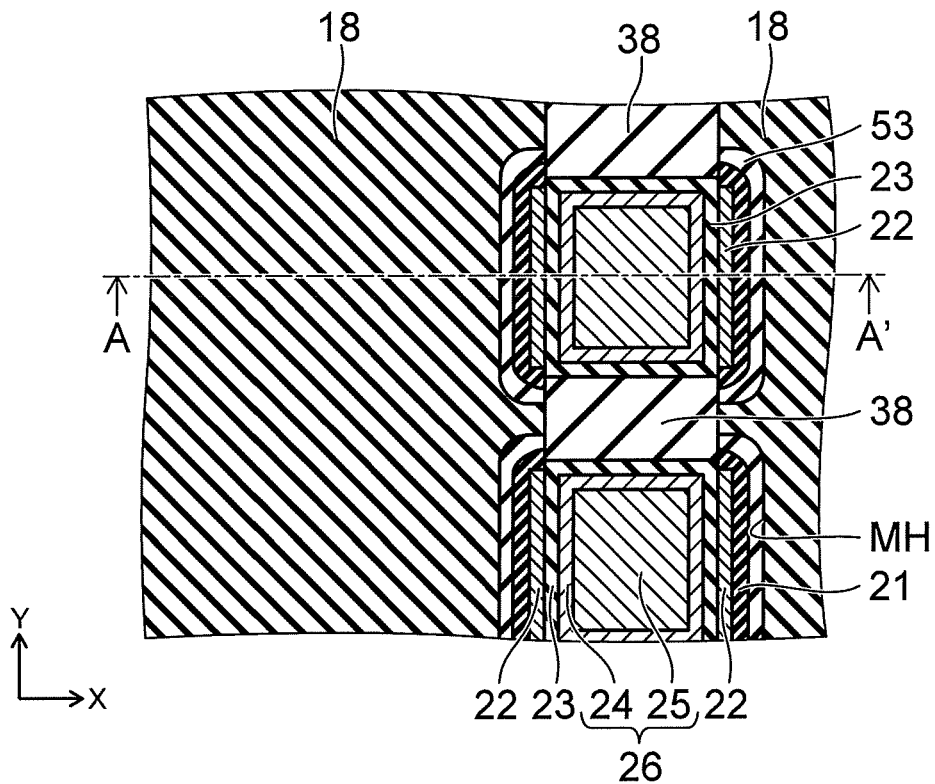
Figure 10B:
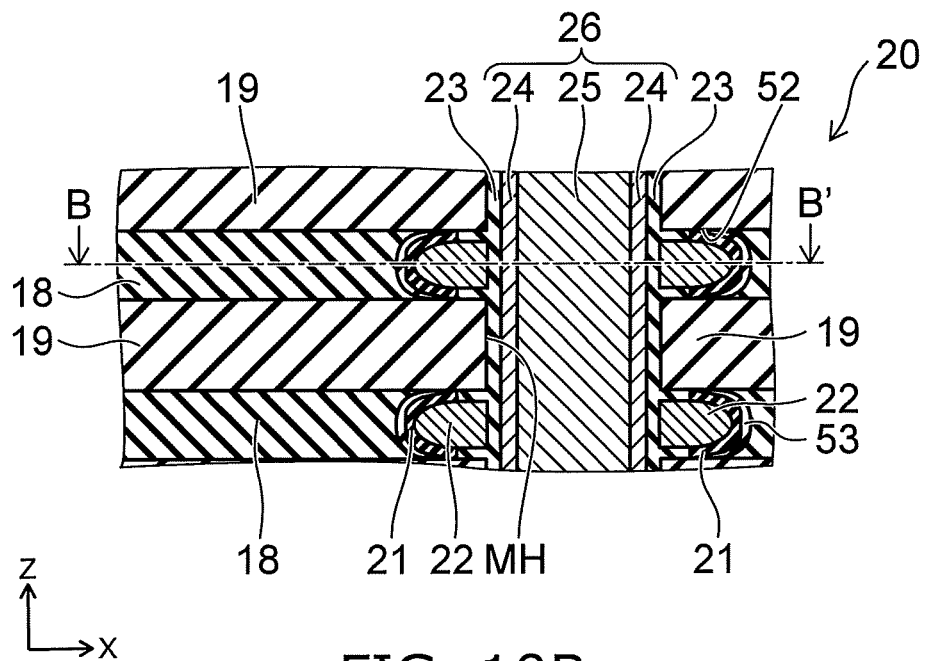

Then, as shown in FIG. 10A, FIG. 10B, and step S10 of FIG. 3, the tunneling insulating film 23 is formed on the inner surfaces of the memory holes MH by, for example, depositing silicon oxide.

Then, as shown in step S11 of FIG. 3, the cover silicon layer 24 is formed on the inner surfaces of the memory holes MH.

Then, as shown in step S12 of FIG. 3, the cover silicon layer 24 and the tunneling insulating film 23 that are deposited on the bottom surfaces of the memory holes MH are removed by performing anisotropic etching such as RIE, etc. Thereby, the cell source line 15 (referring to FIG. 4B) is exposed at the bottom surfaces of the memory holes MH.

Then, as shown in step S13 of FIG. 3, the body silicon 25 is filled into the memory holes MH by depositing silicon using, for example, CVD. The body silicon 25 is formed in a pillar configuration extending in the Z-direction; and the lower end of the body silicon 25 is connected to the cell source line 15. The silicon pillar 26 includes the cover silicon layer 24 and the body silicon 25.

Figure 11A:
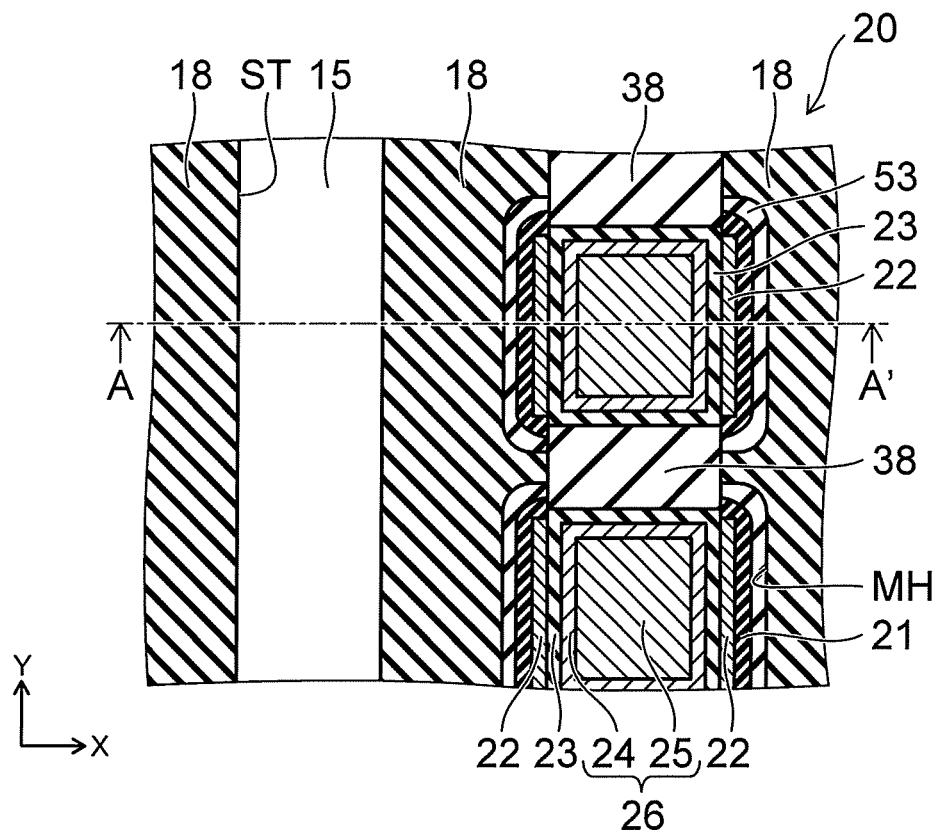
Figure 11B:
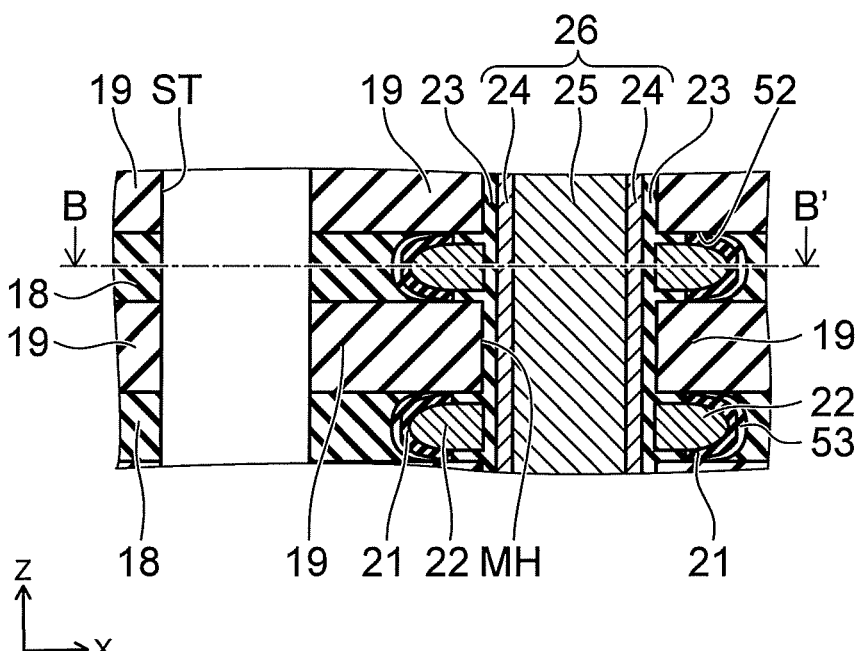

Then, as shown in FIG. 11A, FIG. 11B, and step S14 of FIG. 3, a slit ST that extends in the Y-direction is formed in a portion of the stacked body 20 between the memory trenches MT.

Figure 12A:
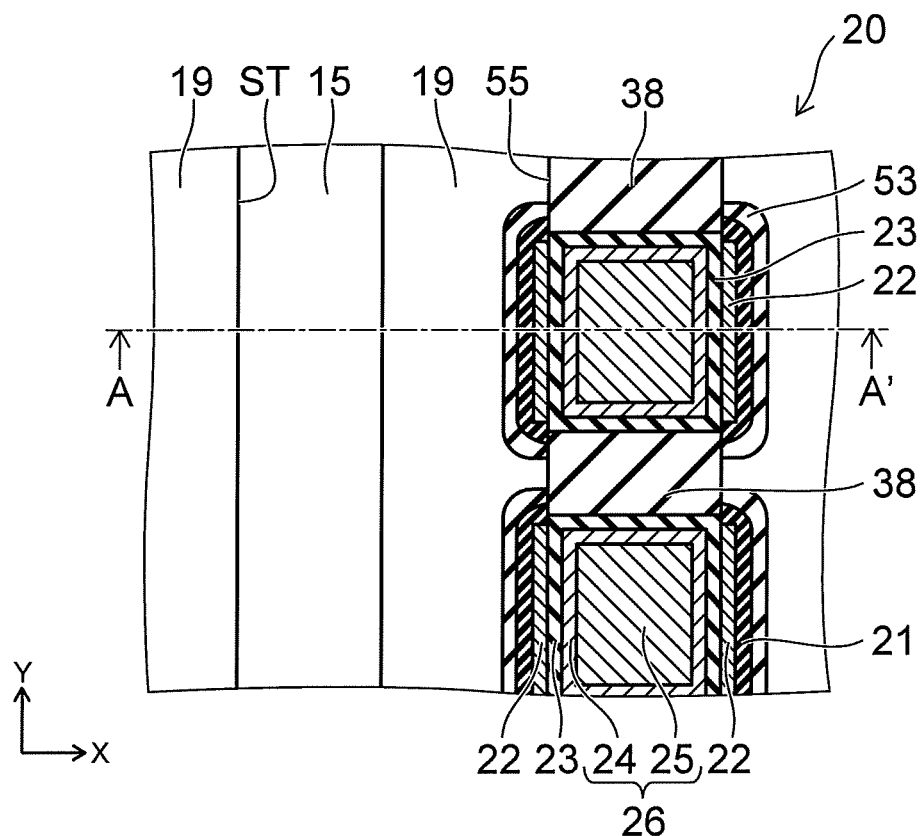
Figure 12B:
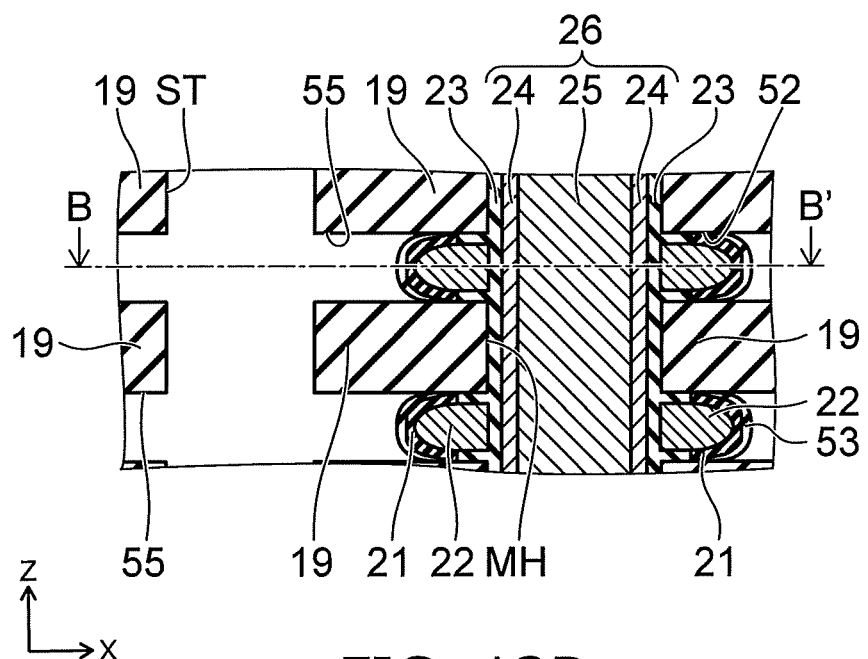

Then, as shown in FIG. 12A, FIG. 12B, and step S15 of FIG. 3, the silicon nitride layers 18 (referring to FIG. 11B) are recessed via the slit ST by, for example, wet etching using hot phosphoric acid. At this time, the dummy oxide layer 53 and the inter-pillar insulating member 38 function as an etching stopper. As a result, recesses 55 that extend in the Y-direction are formed between the silicon oxide layers 19 on the two X-direction sides of the slit ST. The dummy oxide layer 53 and the inter-pillar insulating member 38 are exposed at the back surfaces of the recesses 55.

Figure 13A:
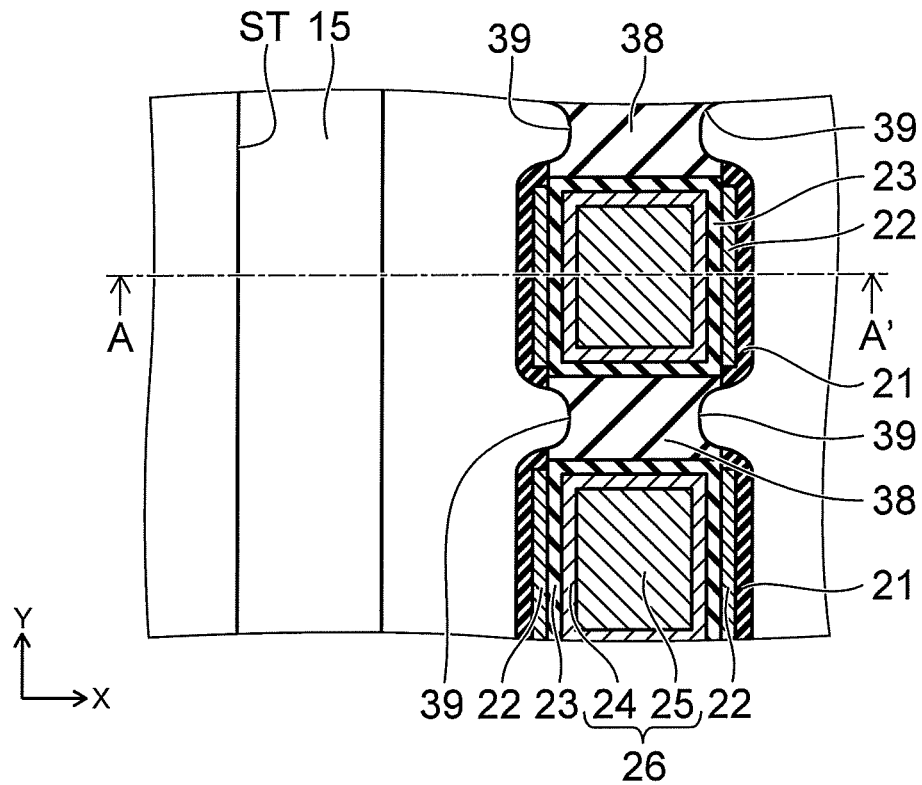
Figure 13B:
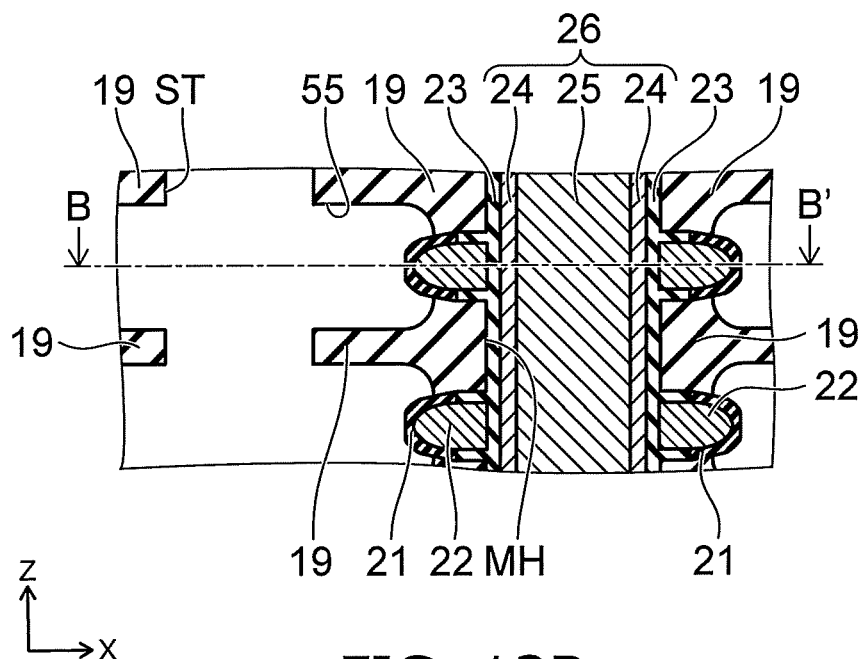

Then, as shown in FIG. 13A, FIG. 13B, and step S16 of FIG. 3, the dummy oxide layer 53 (referring to FIG. 12A) is removed. Thereby, the hafnium oxide layer 21 is exposed at the back surfaces of the recesses 55. Further, at this time, the exposed portions of the silicon oxide layer 19 and the inter-pillar insulating member 38 also are recessed; and the recesses 39 are formed in the side surfaces of the inter-pillar insulating member 38 facing the X-direction.

Figure 14A:
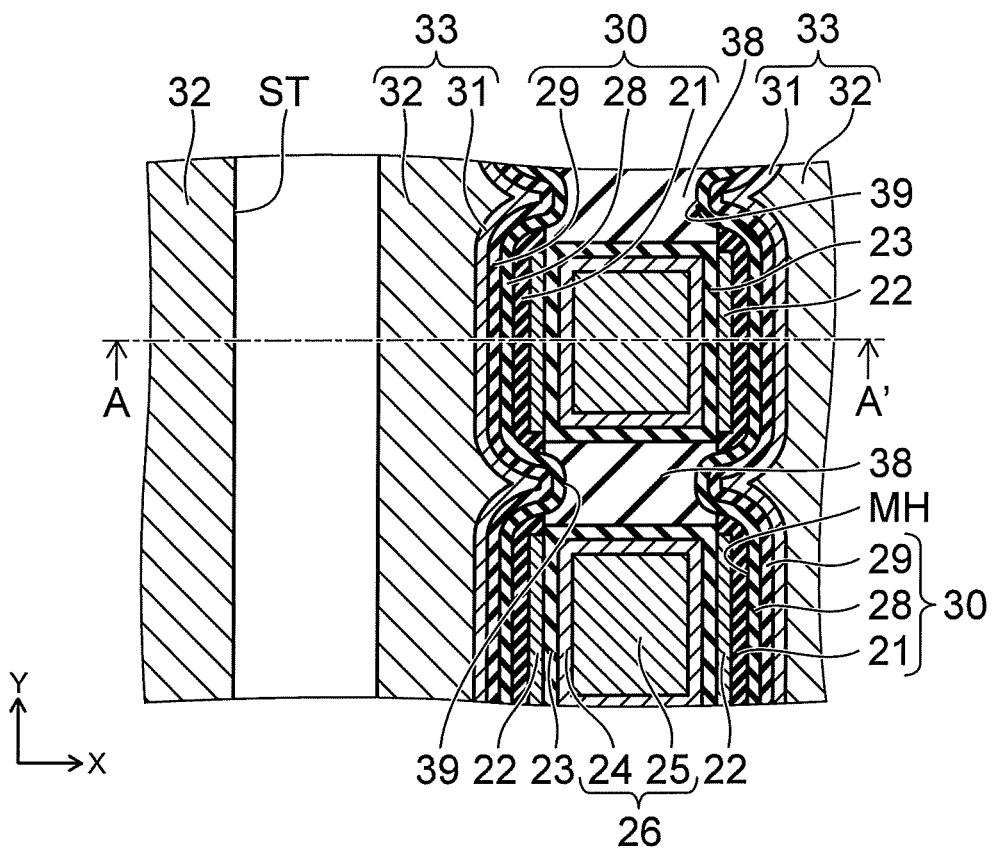
Figure 14B:
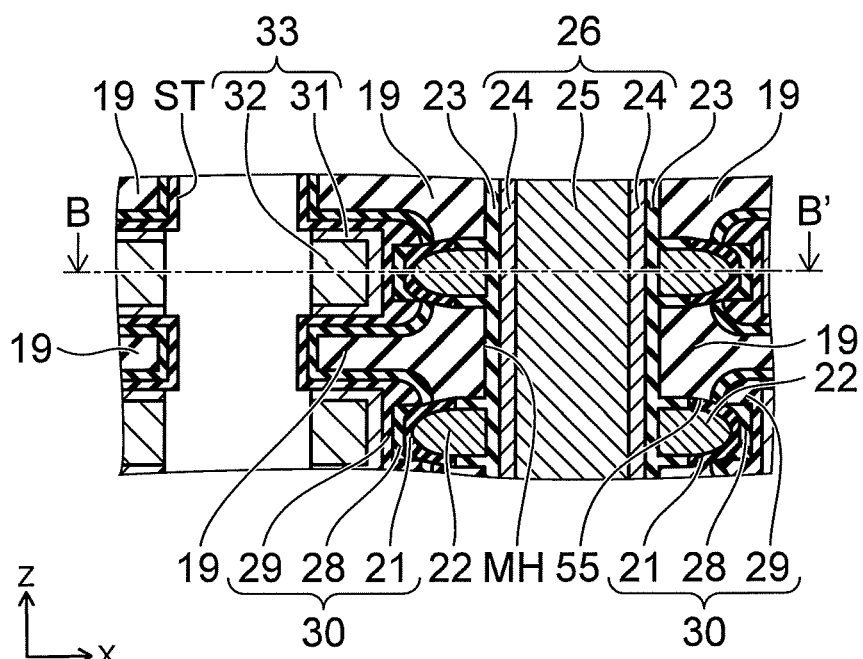

Then, as shown in FIG. 14A, FIG. 14B, and step S17 of FIG. 3, silicon oxide is deposited via the slit ST. Thereby, the silicon oxide layer 28 is formed in the slit ST and on the inner surface of the recess 55. The silicon oxide layer 28 contacts the hafnium oxide layer 21 at the back surfaces of the recesses 55. Also, a portion of the silicon oxide layer 28 enters the recesses 39.

Then, as shown in step S18 of FIG. 3, hafnium oxide is deposited via the slit ST. Thereby, the hafnium oxide layer 29 is formed on the silicon oxide layer 28. The blocking insulating film 30 includes the hafnium oxide layer 21, the silicon oxide layer 28, and the hafnium oxide layer 29.

Then, as shown in step S19 of FIG. 3, the barrier metal layer 31 is formed on the slit ST and the inner surfaces of the recesses 55. Then, the tungsten film 32 is formed on the barrier metal layer 31. Then, etch-back of the tungsten film 32 and the barrier metal layer 31 is performed via the slit ST. Thereby, the barrier metal layer 31 and the tungsten film 32 are divided every recess 55. The control gate electrodes 33 include the barrier metal layer 31 and the tungsten film 32 remaining inside each of the recesses 55.

Then, as shown in FIG. 2A and FIG. 2B, the insulating member 35 is formed by filling silicon oxide into the slit ST.

Then, as shown in FIG. 1A and FIG. 1B, the multiple bit lines 36 that extend in the X-direction are formed on the stacked body 20. Each of the bit lines 36 is connected to the upper ends of the silicon pillars 26 arranged in one column along the X-direction. Thus, the semiconductor memory device 1 according to the embodiment is manufactured.

Effects of the embodiment will now be described.

In the semiconductor memory device 1 according to the embodiment, a portion of the blocking insulating film 30 is disposed on the Y-direction side of the floating gate electrode 22 as shown in FIG. 2A. Thereby, the floating gate electrode 22 is covered with the blocking insulating film 30 from the three directions of the two Y-direction sides and the control gate electrode 33 side in the X-direction. Therefore, the contact surface area between the floating gate electrode 22 and the blocking insulating film 30 is large; and the coupling ratio between the floating gate electrode 22 and the control gate electrode 33 is high. As a result, in the semiconductor memory device 1, the controllability is good; and the reliability of the operation is high.

Also, according to the embodiment, the recess 39 is formed in the side surface of the inter-pillar insulating member 38 facing the X-direction when removing the dummy oxide film 53 in the process shown in FIG. 13A and FIG. 13B. Thereby, the silicon oxide layer 28 and the hafnium oxide layer 29 are formed also on the inner surface of the recess 39 in the process shown in FIG. 14A and FIG. 14B; and a portion of the control gate electrode 33 can be caused to enter the recess 39. As a result, the control gate electrode 33 is formed to cover the floating gate electrode 22; and the coupling ratio between the floating gate electrode 22 and the control gate electrode 33 can be increased even further.

Further, in the embodiment, after forming the memory trench MT in the stacked body 20 in the process shown in FIG. 5A and FIG. 5B, the insulating member 38 is filled into the entire interior of the memory trench MT, and the memory holes MH are formed by etching using the pattern PAA having the line-and-space configuration as a mask in the process shown in FIG. 6A and FIG. 6B. Therefore, the downscaling of the memory hole MH is easy.

Further, the tunneling insulating film 23 and the silicon pillar 26 are formed in the process shown in FIG. 10A and FIG. 10B after dividing the silicon film 22a into the multiple floating gate electrodes 22 by etching the silicon film 22a in the processes shown in FIG. 8A, FIG. 8B, FIG. 9A, and FIG. 9B. Therefore, the tunneling insulating film 23 and the silicon pillar 26 are not formed when etching the silicon film 22a. Thereby, a bird's beak due to damage of the tunneling insulating film 23 due to the etching of the silicon film 22a does not occur; and the end surface of the silicon pillar 26 is not damaged. Accordingly, according to the embodiment, good states of the tunneling insulating film 23 and the silicon pillar 26 can be maintained; and the reliability of the semiconductor memory device 1 can be increased.

A second embodiment will now be described.

Figure 15:
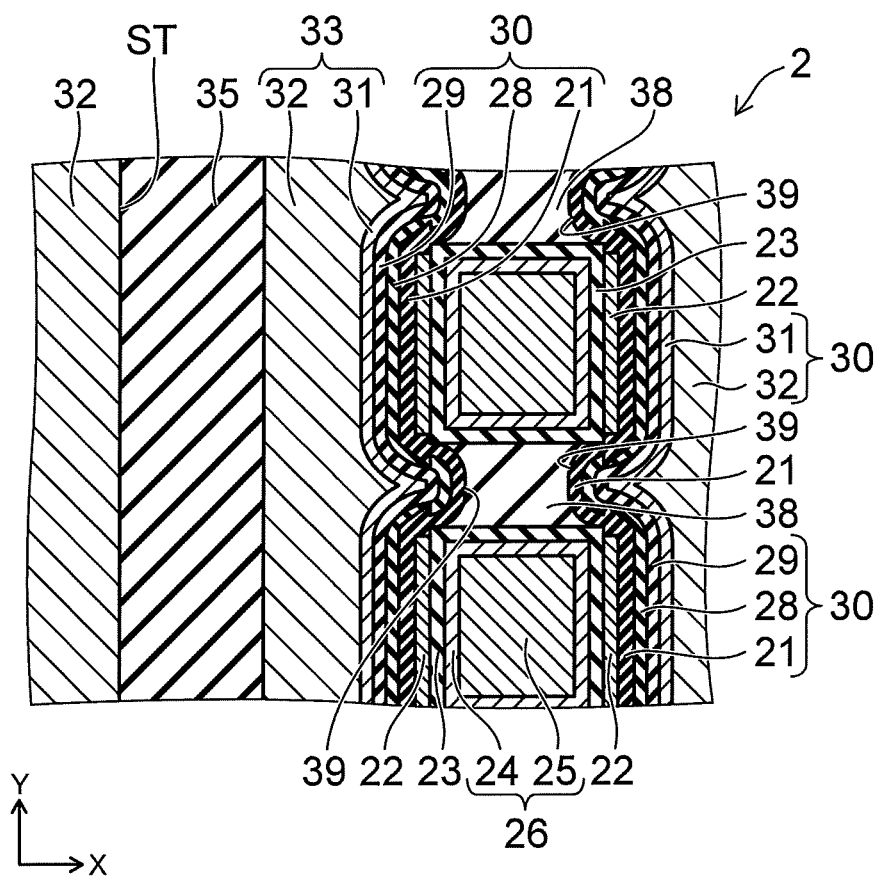
FIG. 15 is a cross-sectional view illustrating a semiconductor memory device according to a second embodiment.

FIG. 15 is a cross-sectional view illustrating a semiconductor memory device according to the embodiment.

Of the insulating layers included in the blocking insulating film 30 in the semiconductor memory device 2 according to the embodiment as shown in FIG. 15, the hafnium oxide layer 21 that is disposed furthest on the floating gate electrode 22 side is not divided every silicon pillar 26 and is provided to be continuous, passing through at the side of the multiple silicon pillars 26 arranged along the Y-direction.

The semiconductor memory device 2 that has such a configuration can be realized by forming the hafnium oxide layer 21 via the slit ST prior to forming the silicon oxide layer 28 in the process shown in FIG. 14A and FIG. 14B without forming the hafnium oxide layer 21a inside the memory hole MH in the process shown in FIG. 8A and FIG. 8B.

According to the embodiment, the hafnium oxide layer 21a is not formed inside the memory hole MH in the process shown in FIG. 8A and FIG. 8B; therefore, the memory hole MH is larger by this amount when forming the silicon film 22a. Thereby, the patterning of the silicon film 22a in the process shown in FIG. 9A and FIG. 9B is easy. Also, the manufacturing processes can be simplified because the patterning of the hafnium oxide layer 21a is unnecessary.

Otherwise, the configuration, the manufacturing method, and the effects of the embodiment are similar to those of the first embodiment described above.

A third embodiment will now be described.

Figure 16A:
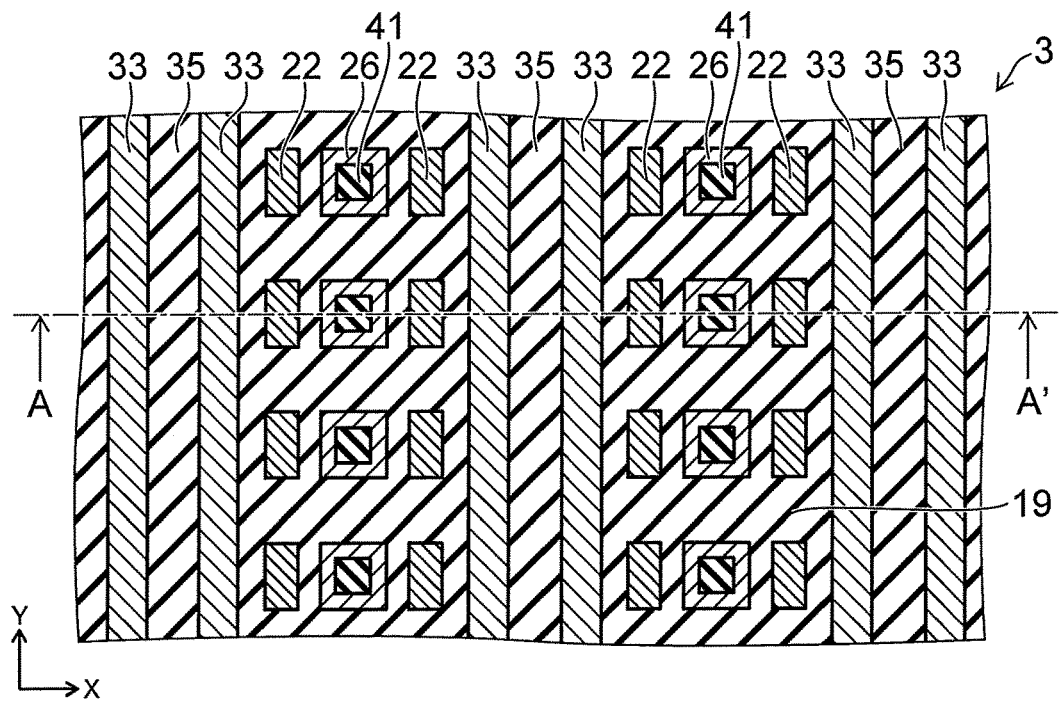
FIG. 16A and FIG. 16B are cross-sectional views illustrating a semiconductor memory device according to a third embodiment.
Figure 16B:
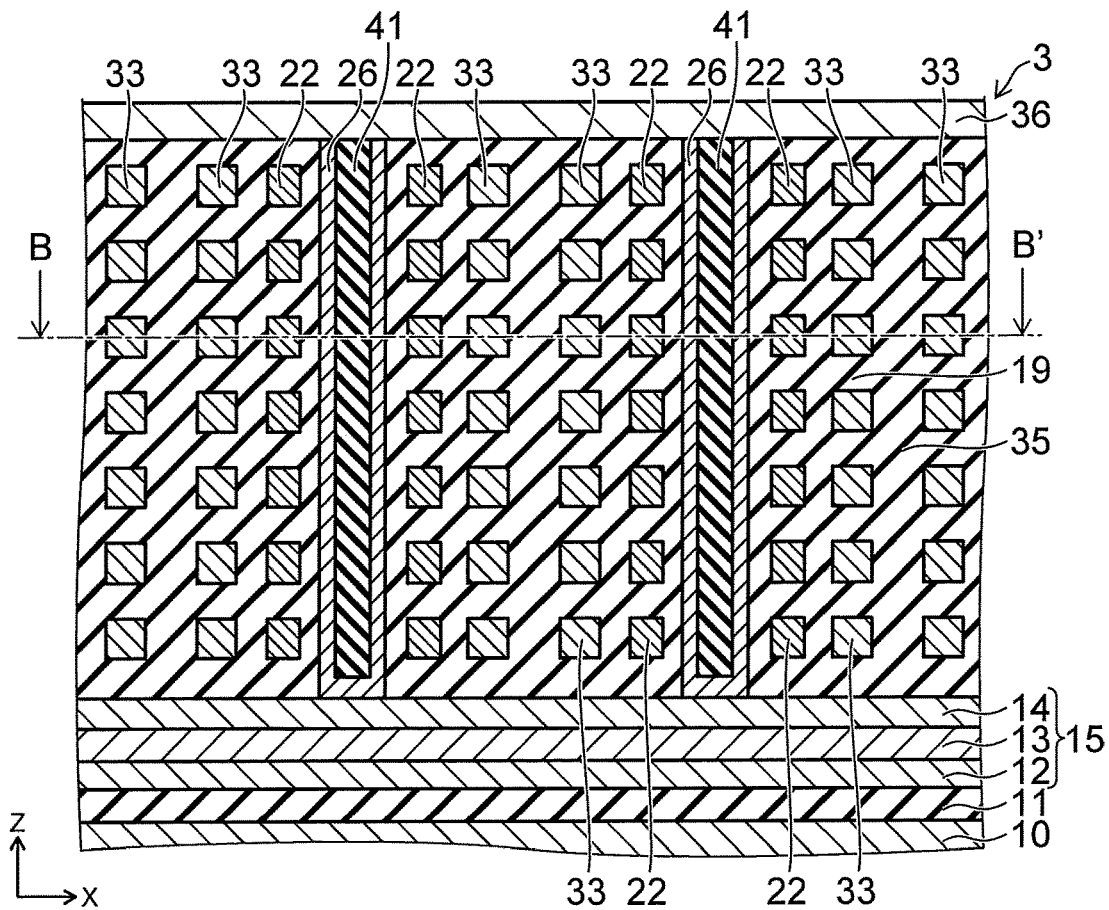

FIG. 16A and FIG. 16B are cross-sectional views illustrating a semiconductor memory device according to the embodiment.

FIG. 16B shows a cross section along line A-A' shown in FIG. 16A; FIG. 16A shows a cross section along line B-B' shown in FIG. 16B.

In the semiconductor memory device 3 according to the embodiment as shown in FIG. 16A and FIG. 16B, a core member 41 that is made of an insulating material such as silicon oxide or the like is provided in the interior of the silicon pillar 26. The core member 41 extends in the Z-direction; and the periphery and lower end of the core member 41 are covered with the silicon pillar 26.

According to the embodiment, by providing the core member 41 that is insulative inside the silicon pillar 26, the portion of the silicon pillar 26 that is not reached easily by the electric field generated from the control gate electrode 33 is removed; and the controllability of the silicon pillar 26 by the control gate electrode 33 can be increased.

Otherwise, the configuration, the manufacturing method, and the effects of the embodiment are similar to those of the first embodiment described above.

A fourth embodiment will now be described.

Figure 17:
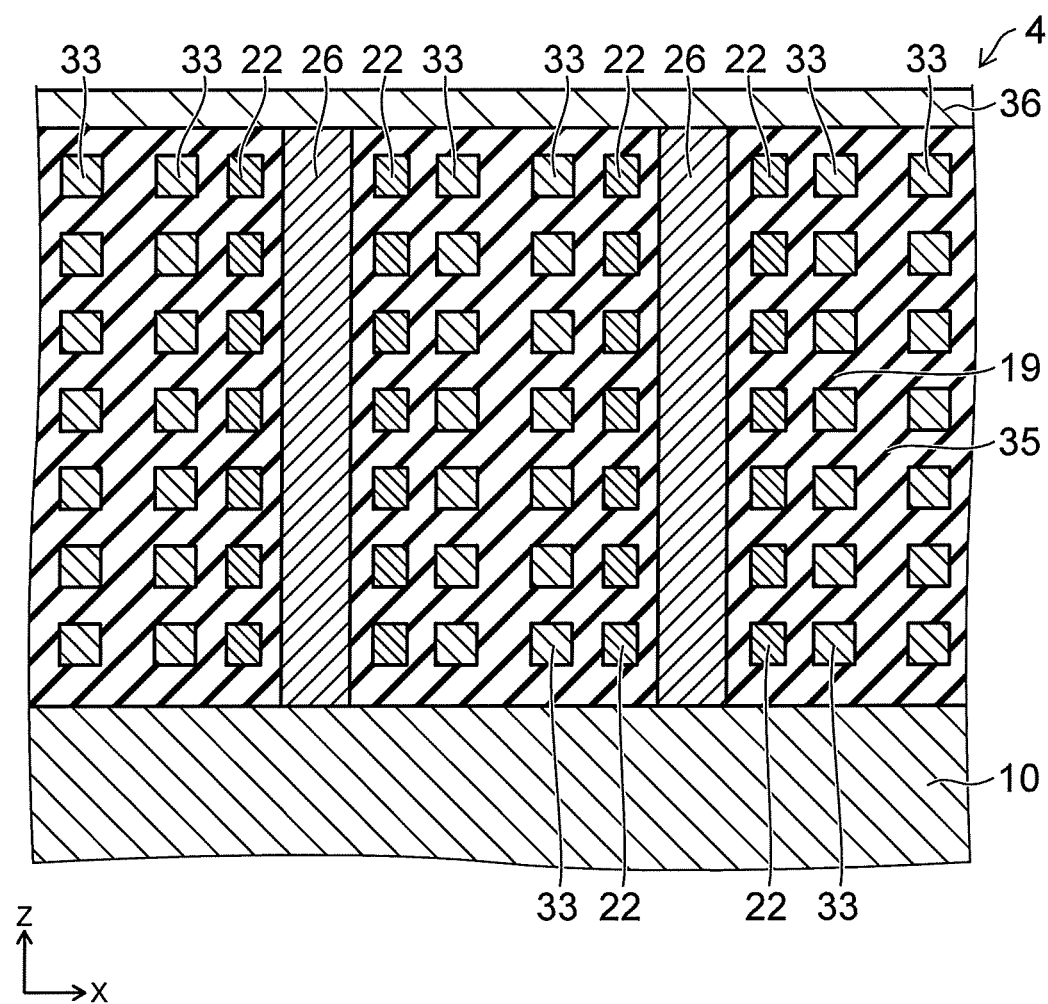
FIG. 17 is a cross-sectional view illustrating a semiconductor memory device according to a fourth embodiment.

FIG. 17 is a cross-sectional view illustrating a semiconductor memory device according to the embodiment.

As shown in FIG. 17, the semiconductor memory device 4 according to the embodiment differs from the semiconductor memory device 1 according to the first embodiment described above (referring to FIG. 1B) in that the insulating film 11 and the cell source line 15 are not provided; and the silicon pillar 26 is connected to the silicon substrate 10. In other words, in the semiconductor memory device 4, the upper layer portion of the silicon substrate 10 functions as a cell source line. A contact layer that has an impurity concentration that is higher than that of the periphery may be formed in the portion of the silicon substrate 10 connected to the silicon pillar 26.

Otherwise, the configuration, the manufacturing method, and the effects of the embodiment are similar to those of the first embodiment described above.

According to the embodiments described above, a semiconductor memory device and a method for manufacturing the semiconductor memory device can be realized in which the reliability is high.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor memory device, comprising:
   a first electrode extending in a first direction;
   a second electrode being adjacent to the first electrode in a second direction crossing the first direction, the second electrode extending in the first direction;

a first pillar being provided between the first electrode and the second electrode, extending in a third direction crossing the first direction and second direction;

a first insulating layer, including a first insulating layer portion being provided between the first electrode and the first pillar, and a second insulating layer portion being provided between the second electrode and the first pillar;

a third electrode being provided between the first electrode and the first insulating layer portion, the third electrode being separated from the first pillar;

a fourth electrode being provided between the second electrode and the second insulating layer portion, the fourth electrode being separated from the first pillar;

a second insulating layer including a first portion, a second portion, and a third portion, the first portion being provided between the first electrode and the third electrode, the first portion being in contact with the third electrode in the second direction, the second portion being in contact with one end portion, in the first direction, of the third electrode, and the third portion being in contact with another end portion, in the first direction, of the third electrode;

a third insulating layer including a fourth portion, a fifth portion, and a sixth portion, the fourth portion being provided between the second electrode and the fourth electrode, the fourth portion being in contact with the fourth electrode in the second direction, the fifth portion being in contact with one end portion, in the first direction, of the fourth electrode, and the sixth portion being in contact with another end portion, in the first direction, of the fourth electrode; and a fourth insulating layer being provided between the second portion and the fifth portion, wherein the third electrode is connected only to the first insulating layer portion and the first portion in the third direction.

2. The device according to claim 1, further comprising:
a second pillar being adjacent to the first pillar in the first direction, the second pillar being provided between the first electrode and the second electrode, and extending in the third direction,
wherein the fourth insulating layer is further provided between the first pillar and the second pillar.

3. The device according to claim 2, further comprising:
a fifth insulating layer including a fourth insulating layer portion being provided between the first electrode and the second pillar, and a fifth insulating layer portion being provided between the second electrode and the second pillar;

a fifth electrode being provided between the first electrode and the fourth insulating layer portion;

a sixth electrode being provided between the second electrode and the fifth insulating layer portion;

a sixth insulating layer being provided between the first electrode and the fifth electrode, in contact with one end portion, in the first direction, of the fifth electrode and another end portion, in the first direction, of the fifth electrode; and a seventh insulating layer being provided between the second electrode and the sixth electrode, in contact with one end portion, in the first direction, of the sixth electrode and another end portion, in the first direction, of the sixth electrode.

4. The device according to claim 2, further comprising:
a third memory cell between the second pillar and the first electrode to store third information; and
a fourth memory cell between the second pillar and the second electrode to store fourth information.

5. The device according to claim 1, further comprising:
a first memory cell between the first pillar and the first electrode to store first information; and
a second memory cell between the first pillar and the second electrode to store second information.

6. The device according to claim 1, wherein
a first length of the second portion in the first direction is less than a second length of the fourth insulating layer in the first direction.

7. The device according to claim 1, wherein
the first insulating layer further includes a third insulating layer portion being provided between the fourth insulating layer and the first pillar.

8. The device according to claim 1, wherein
the third electrode and the fourth electrode are conductive.

9. The device according to claim 7, wherein
the first insulating layer portion, the second insulating layer portion, and the third insulating layer portion are connected to surround the first pillar.

10. The device according to claim 1, wherein the fourth electrode is connected only to the second insulating layer portion and the fourth portion in the third direction.

* * * * *